United States Patent
Qiu et al.

(10) Patent No.: US 7,188,324 B1
(45) Date of Patent: Mar. 6, 2007

(54) ASSERTION MORPHING IN FUNCTIONAL VERIFICATION OF INTEGRATED CIRCUIT DESIGN

(75) Inventors: Xiaogang Qiu, Sunnyvale, CA (US);
Si-En Chang, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 339 days.

(21) Appl. No.: 10/893,472

(22) Filed: Jul. 16, 2004

(51) Int. Cl.
*G06F 17/50* (2006.01)

(52) U.S. Cl. .............................. 716/4; 716/5
(58) Field of Classification Search ............... 716/4, 716/5
See application file for complete search history.

(56) References Cited

U.S. PATENT DOCUMENTS

| | | | |
|---|---|---|---|
| 4,433,387 A * | 2/1984 | Dyer et al. ............... | 702/159 |
| 4,918,621 A * | 4/1990 | Nado et al. ............... | 706/51 |
| 6,757,852 B1 * | 6/2004 | Ghassemi et al. .......... | 714/711 |
| 7,031,896 B1 * | 4/2006 | Yang ....................... | 703/13 |

OTHER PUBLICATIONS

"Expert Systems Diagnosis Via an Assertion-Justification Backtracking Algorithm for Diagnosing Anomalities in Sensor-Based Syatem", IBM Technical Disclosure Bulletin, Sep. 1, 1987, vol. 30, issu. 4, pp. 1633-1636.*

* cited by examiner

*Primary Examiner*—Sun James Lin
(74) *Attorney, Agent, or Firm*—Gunnison, McKay & Hodgson, L.L.P.; Philip J. Mckay

(57) ABSTRACT

A method and apparatus provides a mechanism to transform or "morph" Formal verification method assertions so that an assertion defined in one Design Under Test (DUT) can be replicated, or derived, to propagate into other related DUTs. Using the method and apparatus of the present invention, individual DUTs can better leverage assertions defined independently in other DUT environments. This, in turn, provides for greater productivity and a faster, smoother verification process-using Formal and Assertion Based Verification methods.

7 Claims, 6 Drawing Sheets

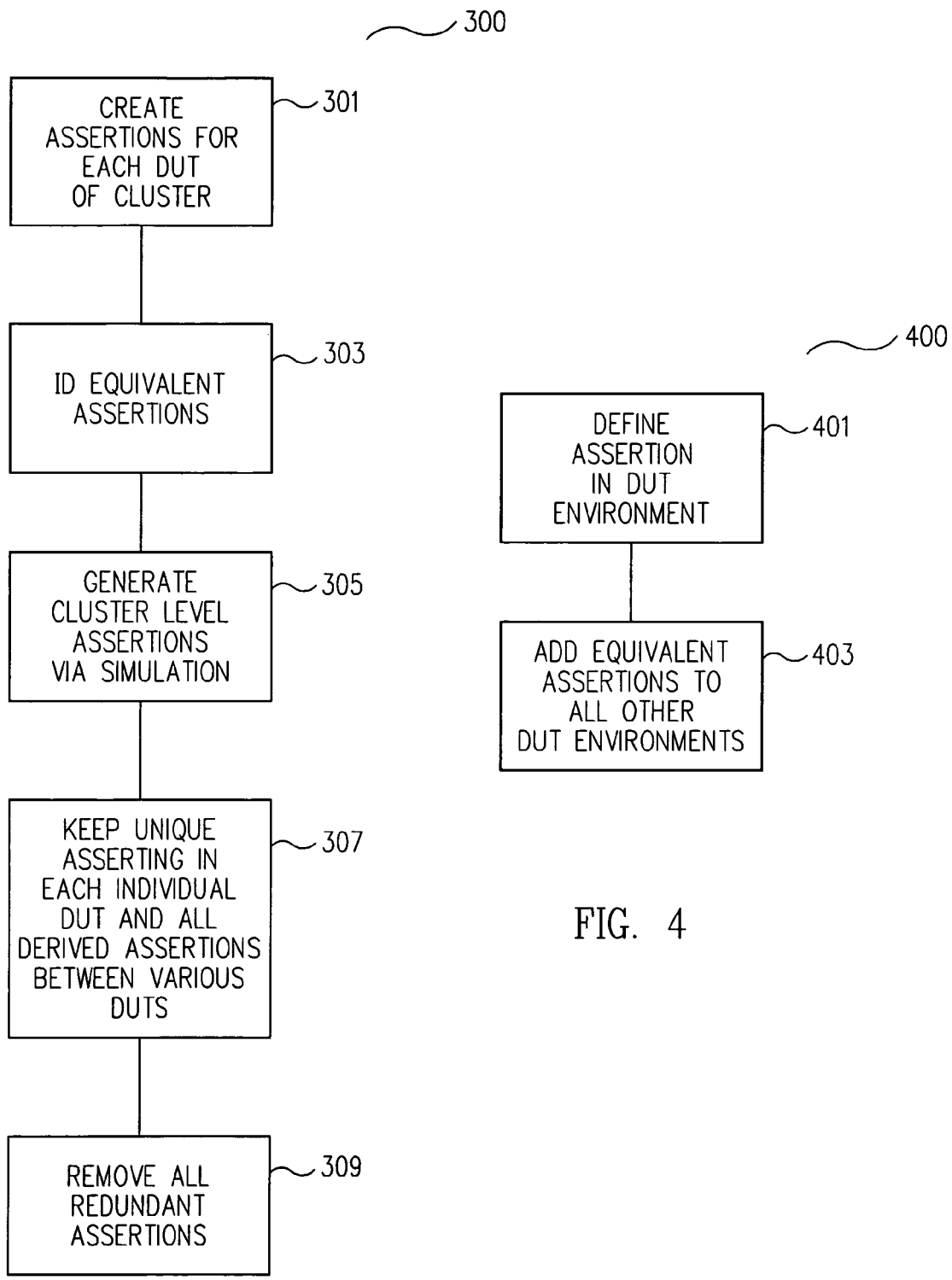

ASSERTION MORPHING IN FUNCTIONAL VERIFICATION OF INTEGRATED CIRCUIT DESIGN

FIELD OF THE INVENTION

The present invention relates generally to functional verification of integrated circuit systems such as microprocessors and ASICs and, in particular, to a method and structure for accelerating the functional verification of integrated circuit systems using assertion morphing.

BACKGROUND OF THE INVENTION

System designers and engineers have continuously invented and employed methods and notations for modeling, specifying, simulating, verifying and controlling the designs of digital systems. As digital systems and, in particular, chips such as microprocessors and Application Specific Integrated Circuits (ASICs) have become more and more complex, with smaller feature sizes, and more components and functions employed on a single system or chip, function verification of integrated circuit design has become one of the most complicated and time consuming parts of the design process. In many cases, seventy percent, or more, of the design process is spent on functional verification of the design. To make matters worse, even when the considerable resources discussed above are dedicated to the functional verification of the design, there is still no guarantee that the resulting design will be error or "bug" free. Often, hidden bugs do not present themselves until late in the design process, even after tape-out of the design. This situation is particularly problematic since the later a bug appears, the harder it is to correct because any change in one part of the system inevitably affects another part of the system. Consequently, the later the bug is found, the more collateral subsystems are affected and the more complicated it is to fix.

In the prior art, two verification methods were widely accepted, the Simulation method and the Formal method, each having its own strengths and weaknesses relative to the other. The Simulation method is well known to those of skill in the art and has long been the verification method of choice because it is viewed as the simplest method and it can be employed to verify larger portions of a design under test, including a cluster, an entire system or an entire chip. The Simulation method relies on a set of test signals, called a test bench or test vector, which are fed into the design while the outputs and internal processing are monitored.

While easy to run, and the verification method of choice in the prior art, the Simulation method does not represent the most through or comprehensive test available and, therefore, is more susceptible to latent bugs that can present themselves late in the process; thereby creating the problems discussed above. For this reason, it is believed that, as integrated circuit systems become more complex, the Simulation method will become less used in favor of more robust and through verification methods.

The other verification method well known to those of skill in the art is the Formal method. The Formal method involves the use of mathematical models to theoretically, and exhaustively, verify the state space of a portion of the system under test. While the Formal method is the more comprehensive verification method, it has historically not been the method of choice for two reasons. First, historically, the Formal method could only be used on relatively small portions of the system and could not typically be used to verify an entire system such as a microprocessor in the whole. Consequently, to verify a complete system, the system had to be broken into a plurality of smaller parts, or "blocks" for use as the design under test. Second, the Formal method was difficult to formulate and involved the use of assertions and/or constraints. Assertions define certain behaviors and relationships of involved signals in a particular design being tested, or in the case of the Formal verification method as used in the prior art, a small portion of the entire system to be verified. Consequently, assertions had to be carefully crafted with great skill and considerable difficulty.

To make matters worse, in the prior art, each one of the plurality of blocks making up the system as a whole was verified separately, and often by different teams or individuals, and each block required its own set of assertions defined and used only in that block. As a result, not only was it extremely difficult to craft a proper set of assertions for any given block, but, in addition, each block had to have its own set of assertions created, often with significant redundancy. In addition, as systems became increasingly complex, using the Formal method, a given system needed to be broken down into more and more blocks. Consequently, while, in the prior art, the Formal method was recognized as the more robust and complete verification method, it was felt that the system as a whole, and the interaction of the various components of the system, could not be verified using the Formal method without prohibitive expense and use of resources.

A hybrid verification method, called Assertion Based Verification, combines the Simulation and Formal methods. Using Assertion Based Verification, Formal verification engines accept assertions as target properties to search or as constraint properties defining boundary conditions. The constraint assertions are then used as the assertions that define properties of a valid input for the Design Under Test (DUT). Using Assertion Based Verification, the Formal verification engine does not prove or disprove constraint assertions, but rather uses the constraint assertions to generate valid verification results. Consequently, using Assertion Based Verification, the target assertions are the design properties that the Formal verification engine tries to prove or disprove within the DUT.

Using Assertion Based Verification, once a design has been verified using the Formal method, the design is then still verified using the Simulation method. In this instance the assertions are used as monitors to find bugs in the Simulation and the assertions used as constraints in the Formal method are verified by the Simulation method. However, since, using prior art methods, assertions are often duplicated between DUTs, the Simulation method using these assertions as monitors results in redundant, contradictory and inefficient monitoring and reporting.

Since Assertion Based Verification, like the Formal method of verification, relied on, and was only as good as, carefully crafted assertions and constraints, Assertion Based Verification also suffered from the complexity, redundancy and complications associated with the Formal method discussed above.

Simulation, Formal, and Assertion Based Verification methods are well known to those of skill in the art, as are the strengths and weaknesses of each of these prior art methods. Consequently, a more detailed discussion of the Simulation, Formal and Assertion Based Verification methods is omitted here to avoid detracting from the invention. If the reader wishes a more detailed discussion of Simulation, Formal and Assertion Based Verification methods, the reader is referred to any one of numerous texts on the subject of verifiable RTL design. As one example, the reader is referred to "Principles of Verifiable RTL Design, A functional coding style supporting verification processes in Verilog" by Lionel Bening and Harry Foster, second edition, Kluwer Academic Publishers, Boston/Dordrecht/London, 2001, ISBN 0-7923-7368-5.

As noted above, in the both the Formal verification and the Assertion Based Verification methods of the prior art, the assertions must be carefully crafted, with great difficulty and, in the prior art, an assertion defined in one block or Design Under Test (DUT) was restricted to that DUT. Since as discussed above, using the prior art Formal or Assertion Based Verification methods, the DUT was typically a relatively small portion of the system as a whole, defining a set of assertions for the entire system, i.e., multiple DUT's, was prohibitively costly and difficult.

FIG. 1 shows a DUT_D that is a cluster of smaller DUTs such as DUT_A, DUT_B, and DUT_C. As noted above, Formal verification engines can typically only handle smaller size DUTs such as DUT_A, DUT_B, and DUT_C, but not larger, cluster or system size DUTs, such as DUT_D. As also noted above, this limited capacity of the Formal method results from the exhaustive nature of the analysis. Typically, these smaller DUTs, such as DUT_A, DUT_B, and DUT_C are called "block" level DUTs as opposed to cluster or "full-chip" level DUT_D. Unfortunately, the preferred level to build a simulation test environment is the cluster or "full-chip" level DUT_D because, as noted above, this provides information on block level interactions rather than individual block behavior. This is the primary reason the Simulation method was the method of choice in the prior art.

As noted above, to employ the Formal method or the Assertion Based Verification method, the verification must be performed on individual blocks DUT_A, DUT_B, and DUT_C, and not cluster block DUT_D. In addition, as also discussed above, in the prior art, assertions defined in any one of the individual blocks DUT_A, DUT_B, and DUT_C could only be used in that DUT and not in any of the other DUTs. Consequently, in the prior art, multiple sets of potentially redundant assertions had to be created.

As an example, in FIG. 1, assertions a1, a2 and a3 are defined in DUT_A and therefore regulate signals within the scope of DUT_A. Likewise, assertions b1, b2 and b3 are defined in DUT_B and therefore regulate signals within the scope of DUT_B and assertions c1, c2 and c3 are defined in DUT_C and therefore regulate signals within the scope of DUT_C. In addition, assertions d1, d2 and d3 are defined in DUT_D and therefore regulate signals within the scope of DUT_D. Consequently, using prior art Formal or Assertion Based Verification methods, assertions a1, a2, and a3 would be recognized for DUT_A and could act as either targets or constraints of DUT_A. However, using prior art methods, all other assertions b1, b2, b3, c1, c2, c3, d1, d2, and d3 were not involved when verifying DUT_A in DUT_A's environment because the signals used to define assertions other than a1, a2 and a3 were not considered part of DUT_A. Likewise, using prior art Formal or Assertion Based Verification methods, assertions b1, b2, and b3 were recognized for DUT_B and acted as either targets or constraints of DUT_B. However, using prior art methods, all other assertions a1, a2, a3, c1, c2, c3, d1, d2, and d3 were not involved when verifying DUT_B in DUT_B's. Likewise, using prior art Formal or Assertion Based Verification methods, assertions c1, c2, and c3 were recognized for DUT_C and acted as either targets or constraints of DUT_C. However, using prior art methods, all other assertions b1, b2, b3, a1, a2, a3, d1, d2, and d3 were not involved when verifying DUT_C in DUT_C's environment because the signals used to define assertions other than c1, c2 and c3 were not considered part of DUT_C. Finally, using prior art Formal or Assertion Based Verification methods, assertions d1, d2, and d3 were recognized for DUT_D and acted as monitors during simulation. All other assertions b1, b2, b3, c1, c2, c3, a1, a2, and a3 are included in DUT_D's simulation environment because they are within DUT_D.

As discussed above, assertions a1, a2, a3, b1, b2, b3, c1, c2, c3, d1, d2 and d3 define certain behaviors and relationships of involved signals in the particular design being tested, i.e., DUT_A, DUT_B, DUT_C and DUT_D, respectively. Consequently, assertions a1, a2, a3, b1, b2, b3, c1, c2, c3, d1, d2 and d3 had to be crafted with great care and significant energy and resources. However, as noted above, in the prior art, each one of the plurality of, DUTs making up the cluster DUT_D, i.e., DUT_A, DUT_B and DUT_C, was verified separately, in relative isolation, and often by different teams or individuals. As a result, not only was it extremely difficult to craft a proper set of assertions for any given DUT, such as DUT_A, DUT_B and DUT_C, but, in addition, each DUT had to have its own set of assertions created, often with significant redundancy and significant waste of time and resources.

In addition, as also noted above, as systems become more and more complex, using the Formal method, a given cluster DUT such as DUT_D needs to be broken down into more and more block DUTs, such as DUT_A, DUT_B and DUT_C. Consequently, as integrated circuit systems become more complex, the problem of redundancy of effort and resources using the prior art methods becomes even more pronounced.

In addition, all non-DUT specific assertions are logically connected to the DUT by design. Clearly it would be preferred to have information propagate automatically to all related DUT blocks, such as DUT_A, DUT_B and DUT_C in a given cluster and/or full chip system, such as DUT_D, in order to leverage all the development efforts of all the designers working on all the different DUTs. In the prior art, significant assertion re-use opportunities between blocks were missed and/or ignored. For instance, any assertion constraint for one DUT will naturally be a good target assertion for another DUT that generates related signals but this fact was ignored in the prior art.

The difficulty in individually defining the assertions for each DUT in the prior art has meant that the Formal method and Assertion Based Verification method of verification have largely been avoided in favor of the easier to implement, but less comprehensive, Simulation method. However, as integrated circuit systems have become increasingly complex the need for more exhaustive verification methods such as the Formal method and Assertion Based Verification method has become greater and greater.

What is needed is a method and apparatus for accelerating the development of assertions and for using assertions more efficiently, and with minimal redundancy to accelerate: the functional verification process, shorten the time-to-market period and improve the quality of design.

SUMMARY OF THE INVENTION

The present invention provides a method and apparatus to transform or "morph" assertions so that an assertion defined in one DUT can be replicated, or derived, to propagate into other related DUTs. Consequently, using the method and apparatus of the present invention, individual DUTs can better leverage assertions developed independently in other DUT environments. This, in turn, provides for greater productivity and a faster, smoother verification process using the Formal and Assertion Based Verification methods.

According to one embodiment of the invention, a list of Formal verification method assertions for each DUT is collected and equivalent assertions are identified from the collected assertions of all block level DUTs comprising the system or cluster level DUT. In addition, in one embodiment of the invention, a list of cluster level DUTs is also generated by using the Simulation verification method. Then, only unique assertions, either generated originally or as a derivative are kept on the list and all other, redundant assertions are dropped.

In one embodiment of the invention, the deriving or "morphing" of assertions is done manually by requiring design engineers to strictly follow the principles of the invention by and checking all potentially "new" assertions against a master list and adding equivalent assertions to each individual DUT environment whenever an assertion is added.

In one embodiment of the invention, called an equivalence-morphing embodiment, a script tool is used to find the best opportunities for morphing, without the need to understand the logic core of the design. In this instance, each assertion from the original assertion set of a given DUT is evaluated to find the direct connection of the involved signals. Then the assertion is replicated and used to replace the involved signals with the corrected signal in a different DUT to form a new assertion. This process is then repeated for each assertion in the original assertion set.

In another embodiment of the invention, called a derived morphing embodiment, the design logic of the DUT is compiled to look for the best morphing opportunities. In this instance, an assertion of a given DUT's original set is selected and the signals to all other DUTs are propagated. Then a derived assertion is constructed through the direct connections, flip-flop delays, logic equations etc. As a result, the derived assertion is logically equivalent to the original assertion. This process is then repeated for each original assertion.

As discussed above, in the prior art, assertions defined in any one of the individual DUTs could only be used in that DUT and not in any of the other DUTs, i.e., each DUT was viewed and verified in virtual isolation form other DUTs and the system as a whole. Consequently, in the prior art, multiple sets of potentially redundant assertions had to be created. However, using the method and structure of the invention, the logical connections between non-DUT specific assertions and the DUT are taken into account, and this information is propagated to all related DUT blocks, in a cluster and/or full chip system in order to leverage all the development efforts of, all the designers working on all the different DUTs of the system.

In addition, using the present invention, significant assertion re-use opportunities between blocks are no longer-missed and/or ignored as they were in the prior art. Consequently, the difficulty in individually defining the assertions for each DUT, in isolation, that plagued prior art methods is bypassed and the redundancy that dominated the prior art methods is eliminated. Therefore, using the principles of the present invention, the Formal and Assertion Based Verification methods, long recognized as the more robust and complete verification methods, can be used practically and economically feasibly to functionally verify entire systems with minimal redundancy. This, in turn, accelerates the functional verification process, shortens the time-to-market period and improves the quality of design.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings:

FIG. 3 is a generalized flow diagram for assertion morphing according to the principles of one embodiment of the invention;

FIG. 4 is a flow diagram for manual assertion morphing according to the principles of one embodiment of the invention;

DETAILED DESCRIPTION

Figure 1:
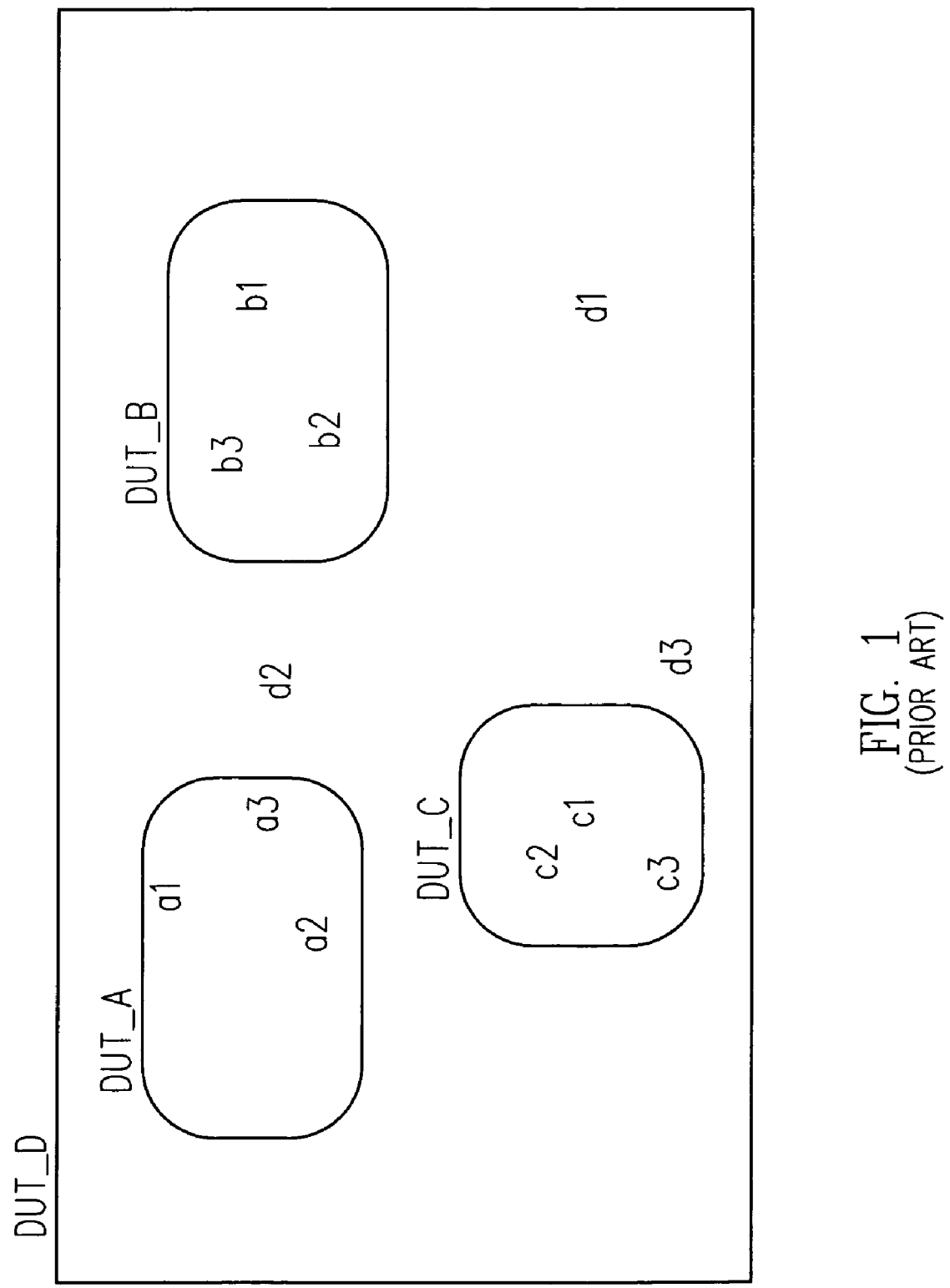
FIG. 1 shows a representation of a cluster or system level Design Under Test (DUT) including block DUTs and various assertions associated with the various DUTs.

The invention will now be described in reference to the accompanying drawings. The same or similar reference numbers may be used throughout the drawings and the following description to refer to the same or like parts.

The present invention provides a method and apparatus to transform or "morph" assertions so that an assertion defined in one DUT can be replicated, or derived, to propagate into other related DUTs. Consequently, using the method and apparatus of the present invention, individual DUTs can better leverage assertions developed independently in other DUT environments. This, in turn, provides for greater productivity and a faster, smoother verification process using the Formal and Assertion Based Verification methods.

According to one embodiment of the invention, a list of Formal verification method assertions for each DUT is collected and equivalent assertions are identified from the collected assertions of all block level DUTs comprising the system or cluster level DUT. In addition, in one embodiment of the invention, a list of cluster level DUTs is also generated by using the Simulation verification method. Then, only unique assertions, either generated originally or as a derivative are kept on the list and all other, redundant assertions are derived.

In one embodiment of the invention, the deriving or "morphing" of assertions is done manually by requiring design engineers to strictly follow the principles of the invention by checking all potentially "new" assertions against the list and adding equivalent assertions to each individual DUT environment whenever an assertion is added to a given DUT.

In one embodiment of the invention, called an equivalence-morphing embodiment, a script tool is used to find the best opportunities for morphing without the need to understand the logic corn of the design. In this instance, each assertion from the original assertion set of a given DUT is evaluated to find the direct connection of the involved signals. Then the assertion is replicated and used to replace the involved signals with the corrected signal in a different DUT to form a new assertion. This process is then repeated for each assertion.

In another embodiment of the invention, called a derived morphing embodiment, the design logic of the DUT is compiled to look for the best morphing opportunities. In this instance, an assertion of a given DUTs original set is selected and the signals to all other DUTs are propagated. Then a derived assertion is constructed through the direct connections, flip-flop delays, logic equations etc. As a result, the derived assertion is logically equivalent to the original assertion. This process is then repeated for each original assertion.

As discussed above, in the prior art, assertions defined in any one of the individual DUTs could only be used in that DUT and not in any of the other DUTs, i.e., each DUT was viewed and verified in virtual isolation form other DUTs and the system as a whole. Consequently, in the prior art, multiple sets of potentially redundant assertions had to be created. However, using the method and structure of the invention, the logical connections between non-DUT specific assertions and the DUT are taken into account, and this information is propagated to all related DUT blocks in a cluster and/or full chip system in order to leverage all the development efforts of all the designers working on all the different. DUTs of the system.

In addition, using the present invention, significant assertion re-use opportunities between blocks are no longer missed and/or ignored as they were in the prior art. Consequently, the difficulty in individually defining the assertions for each DUT, in isolation, that plagued prior art methods is bypassed and the redundancy that dominated the prior art methods is eliminated. Therefore, using the principles of the present invention, the Formal and Assertion Based Verification methods, long recognized as the more robust and complete verification methods, can be used practically and economically feasibly to functionally verify entire systems with minimal redundancy to accelerate the functional verification process, shorten the time-to-market period and improve the quality of design.

Figure 2A:
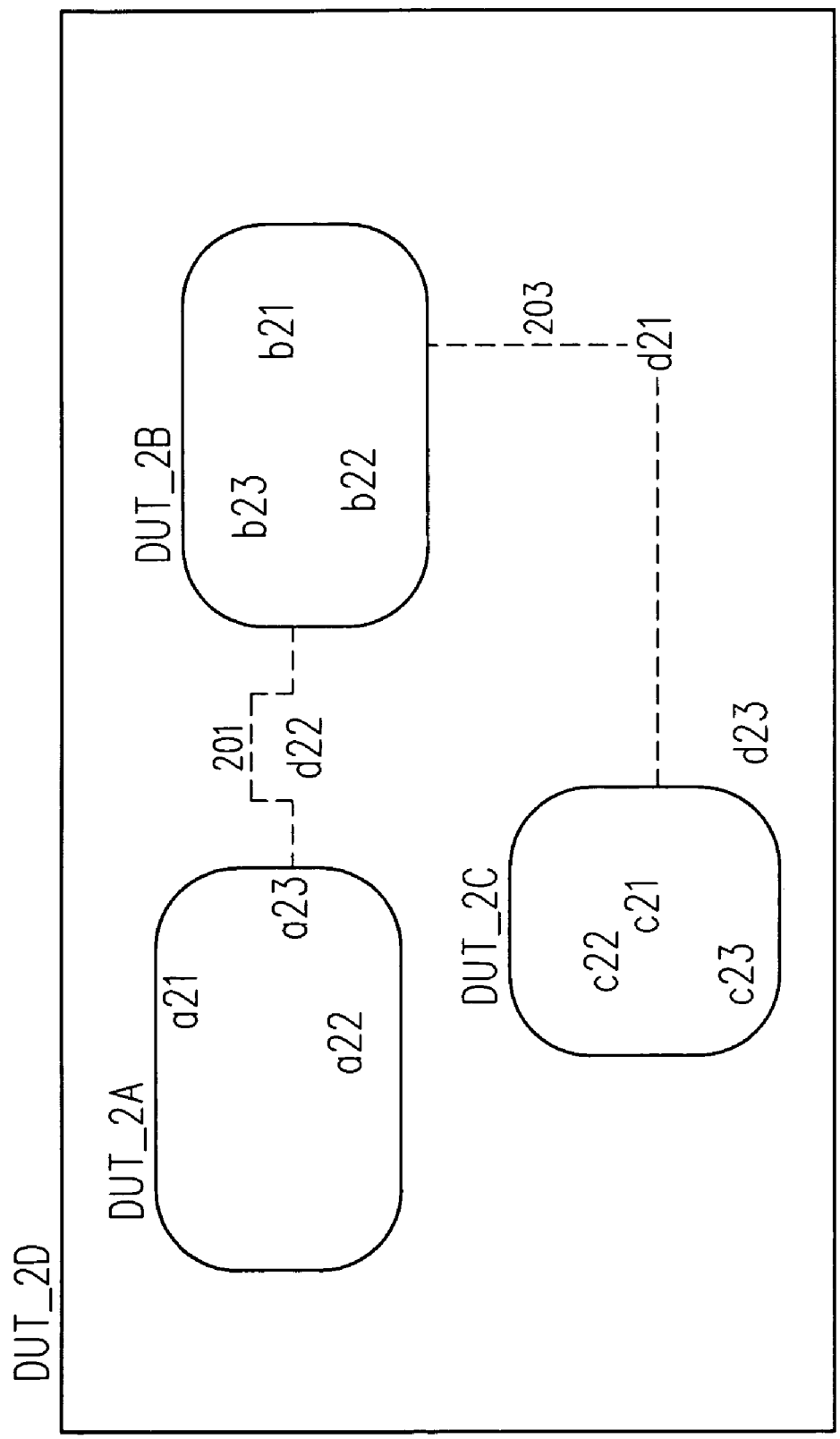
FIG. 2A shows a representation of a cluster or system level. Design Under Test (DUT) including block DUTs and various assertions associated with the various DUTs along with inter-DUTs relationships evaluated according to the principles of one embodiment of the invention.

FIG. 2A shows a DUT_2D that is a cluster of smaller DUTs such as DUT_2A, DUT_2B, and DUT_2C. As noted above, prior art Formal verification engines can typically only handle smaller size DUTs such as DUT_2A, DUT_2B, and DUT_2C, but not lager, cluster or system size DUTs, such as DUT_2D. As also noted above, these smaller DUTs, such as DUT_2A, DUT_2B, and DUT_2C are called "block" level DUTs as opposed to cluster or "full-chip" level. DUT_2D.

As noted above, to employ the Formal method or the Assertion Based Verification method, the verification must be performed on individual blocks DUT_2A, DUT_2B, and DUT_2C, and not cluster block DUT_2D. In addition, as also discussed above, in the prior art, assertions defined in any one of the individual blocks DUT_2A, DUT_2B, and DUT_2C could only be used in that DUT and not in any of the other DUTs. Consequently, in the prior art, multiple sets of potentially redundant assertions had to be created.

As an example, in FIG. 2A, assertions a21, a22 and a23 are defined in DUT_2A and therefore regulate signals within the scope of DUT_2A. Likewise, assertions b21, b22 and b23 are defined in DUT_2B and therefore regulate signals within the scope of DUT_2B and assertions c21, c22 and c23 are defined in DUT_2C and therefore regulate signals within the scope of DUT_2C. In addition, assertions d21, d22 and d23 are defined in DUT_2D and therefore regulate signals within the scope of DUT_2D. Consequently, using prior art Formal or Assertion Based Verification methods, assertions a21, a22, and a23 would be recognized for DUT_2A and could act as either targets or constraints of DUT_2A. However, using prior art methods, all other assertions b21, b22, b23, c21, c22, c23, d21, d22, and d23 were not involved when verifying DUT_2A in DUT_2A's environment because the signals used to define assertions other than a21, a22 and a23 were not considered part of DUT_2A. Likewise, using prior art Formal or Assertion Based Verification methods, assertions b21, b22, and b23 were recognized for DUT_2B and acted as either targets or constraints of DUT_2B. However, using prior art methods, all other assertions a21, a22, a23, c21, c22, c23, d21, d22, and d23 were not involved when verifying DUT_2B in DUT_2B's. Likewise, using prior art Formal or Assertion Based Verification methods, assertions c21, c22, and c23 were recognized for DUT_2C and acted as either targets or constraints of DUT_2C. However, using prior art methods, all other assertions b21, b22, b23, a21, a22, a23, d21, d22, and d23 were not involved when verifying DUT_2C in DUT_2C's environment because the signals used to define assertions other than c21, c22 and c23 were not considered part of DUT_2C. Finally, using prior art Formal or Assertion Based Verification methods, assertions d21, d22, and d23 were recognized for DUT_2D and acted as monitors during simulation. All other assertions b21, b22, b23, c21, c22, c23, a21, a22, and a23 are included in DUT_2D's simulation environment because they are within DUT_2D.

In contrast to the prior art methods, the present invention provides a mechanism for an assertion associated with one DUT to automatically propagate to related DUTs. As an example, in FIG. 2A, assume assertion a23 is a constraint assertion on DUT_2A and the signals are output from DUT_2B, as shown by dotted line 201. In addition, assume assertion d21 defines the interface between DUT_2B and DUT_2C as shown by dotted line 203.

As noted above, using prior art methods, DUT_2B would undergo Formal verification based solely on assertions b21, b22, and b23. Consequently, using prior art methods, the logical connections between assertions a23 and d21 and DUT_2B were not taken into account, and this information was not propagated DUT_2A or DUT_2C. Therefore, using prior art methods, there was no mechanism available to leverage all the development efforts of the designers working DUT_2C and DUT_2D and assertion re-use opportunities between DUTs were missed and/or ignored.

Figure 2B:
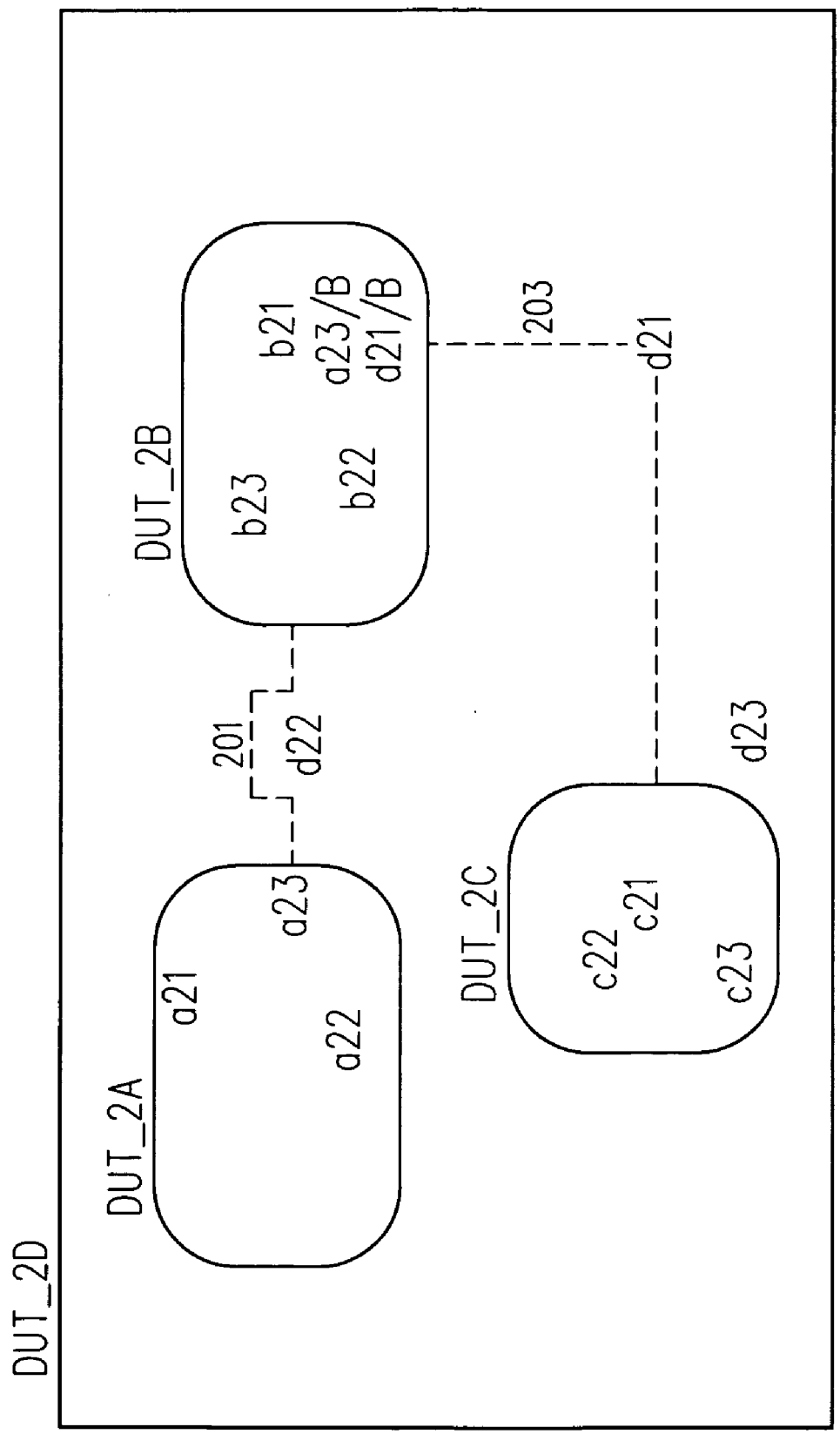
FIG. 2B shows a representation of the cluster or system level Design Under Test (DUT) including block DUTs of FIG. 2A and various assertions associated with the various DUTs along with assertions derived or "Morphed" according to the principles of one embodiment of the invention.

In contrast to the prior art, using the method and structure of the invention, assuming assertion a23 is a constraint assertion on DUT_2A and the signals are output from DUT_2B and that assertion d21 defines the interface between DUT_2B and DUT_2C, assertion a23 and d21 are added to the verification environment of DUT_2B as assertions a23/B and d21/B so that the assertion list for DUT_B becomes b21, b22, b23, a23/B and c21/B as shown in FIG. 2B.

It is worth noting that, according to the present invention, the derived or "morphed" assertions a23/B and d21/B are not identical to assertion a23 and d21 because, at a minimum, assertions a23/B and d21/B are defined upon different signals than assertions a23 and d21. Most likely assertions a23/B and d21/B will be of the same general type as assertion a23 and d21, however, they could be of a different assertion type depending on the efficiency the assertion-morphing engine. Nevertheless, for the purposes of the present invention, all derived assertions, such as assertions a23/B and d21/B are equivalent to the original assertions, such as assertions a23 and d21, in the sense that they describe the same property of design.

FIG. 3 is a general flow diagram 300 for one embodiment of the method of the present invention. As shown in FIG. 3, according to one embodiment of the invention, at 301, a list of Formal verification method assertions for each DUT is collected and, at 303, equivalent assertions are identified from the collected assertions of all block level DUTs comprising the system of cluster level DUT. In addition, in one embodiment of the invention, at 305, a list of cluster level DUTs is generated for the Simulation verification method. Then, at 307, only unique assertions, either generated originally or as a derivative, are kept in each individual DUT environment, for Formal verification or Simulation verification, and derived assertions are kept between different DUT. All redundant assertions are then removed at 309.

FIG. 4 is a flow diagram 400 for one embodiment of the method of the present invention. As shown in FIG. 4, in one embodiment of the invention, the deriving or "morphing" of assertions is done manually by first defining assertions in the individual DUT environments at 401 and then at 403 requiring design engineers to strictly follow the principles of the invention and checking all potentially "new" assertions against the list and adding equivalent assertions to each individual DUT environment whenever an assertion is added.

In one embodiment of the invention, a centralized file or database is created to keep track of the assertions on a given design. Then, according to one embodiment of the invention, if one designer wishes to add or change a particular assertion in his design block, the designer will need to write the assertion in the appropriate assertion description language and save it in a designated place so that any verification tool can access and pick up the assertion. In addition, according to one embodiment of the invention, the designer must edit the centralized tracking file to add the new assertion. In one embodiment of the invention, an e-mail, or other electronic notification, is then automatically sent to all affected designers asking them to derive the assertion into their design blocks. Then the Simulation environment will pick up the tracking file, or a derived version of the tracking file, to avoid instantiate redundant assertions in each of the design blocks.

Figure 5:
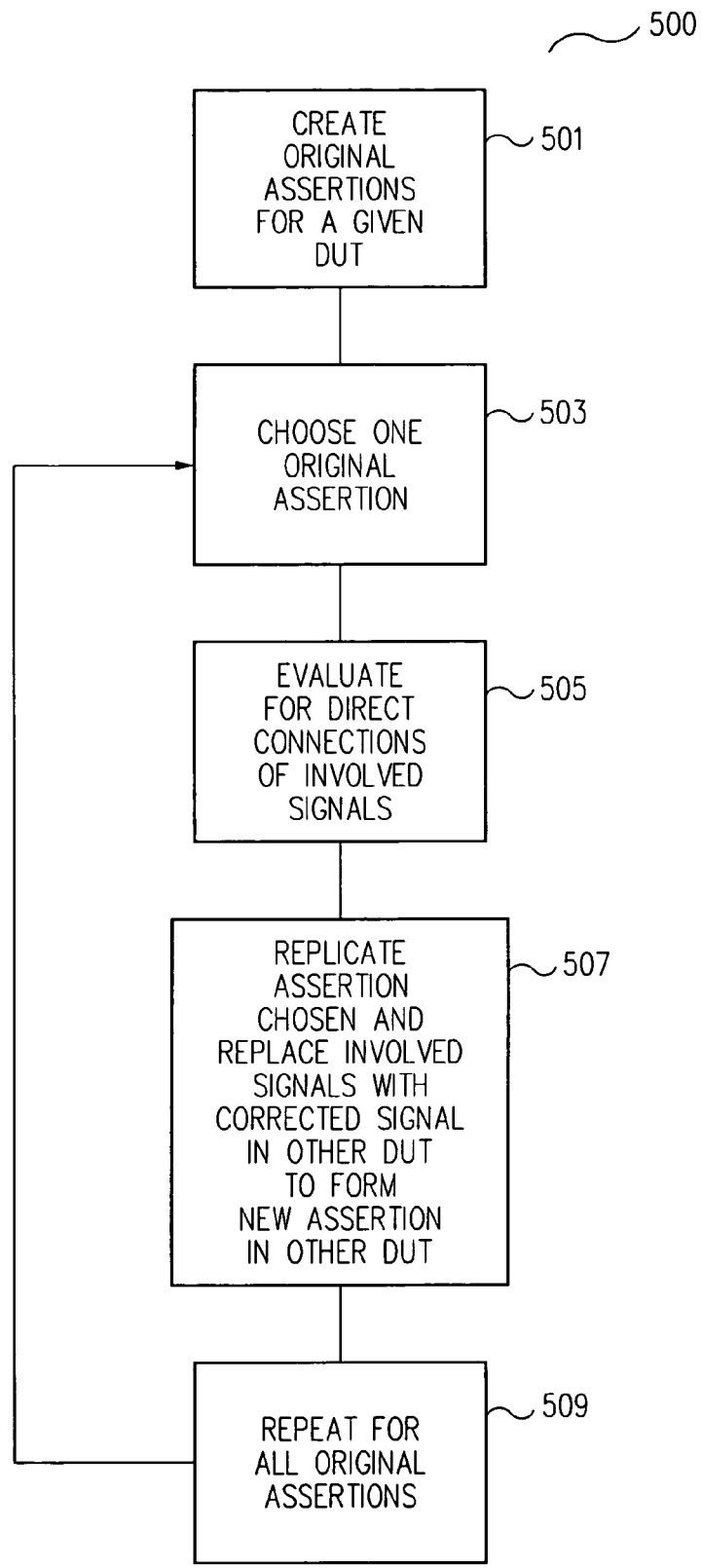
FIG. 5 is a flow diagram for equivalence assertion morphing according to the principles of one embodiment of the invention.

FIG. 5 is a flow diagram 500 for one embodiment of the method of the present invention, called equivalence morphing. As shown in FIG. 5, in one embodiment of equivalence morphing a script tool is created and used to find the best opportunities for morphing without the need to understand the logic core of the design. In this instance, at 501, an original set of assertions is created and at 503, an assertion is chosen from the original assertion set. At 505, the assertion chosen from the original assertion set of a given DUT is evaluated to find the direct connection of the involved signals. At 507, the assertion is replicated and used to replace the involved signals with the corrected signal in a different DUT to form a new assertion. At 509, this process is then repeated for each assertion in the original set.

In one embodiment of the invention, interface signals connect design blocks. Therefore, the same signals exist in two or more blocks. In one embodiment of the invention, the names of the signals are enforced so they are the same in different blocks. Consequently, assertions defined on these signals in one design block can be easily propagated to other connected design blocks. In one embodiment of the invention, a simple script can statically traverse the port connections of the interface signals, and replicate the assertions defined on them to all appropriate DUT environments, without understanding the logic content, to make sure that one, and only one, assertion exists in each environment for the particular assertion content. According to the invention, this script tool automates the "morphing" practice for some assertions.

Figure 6:
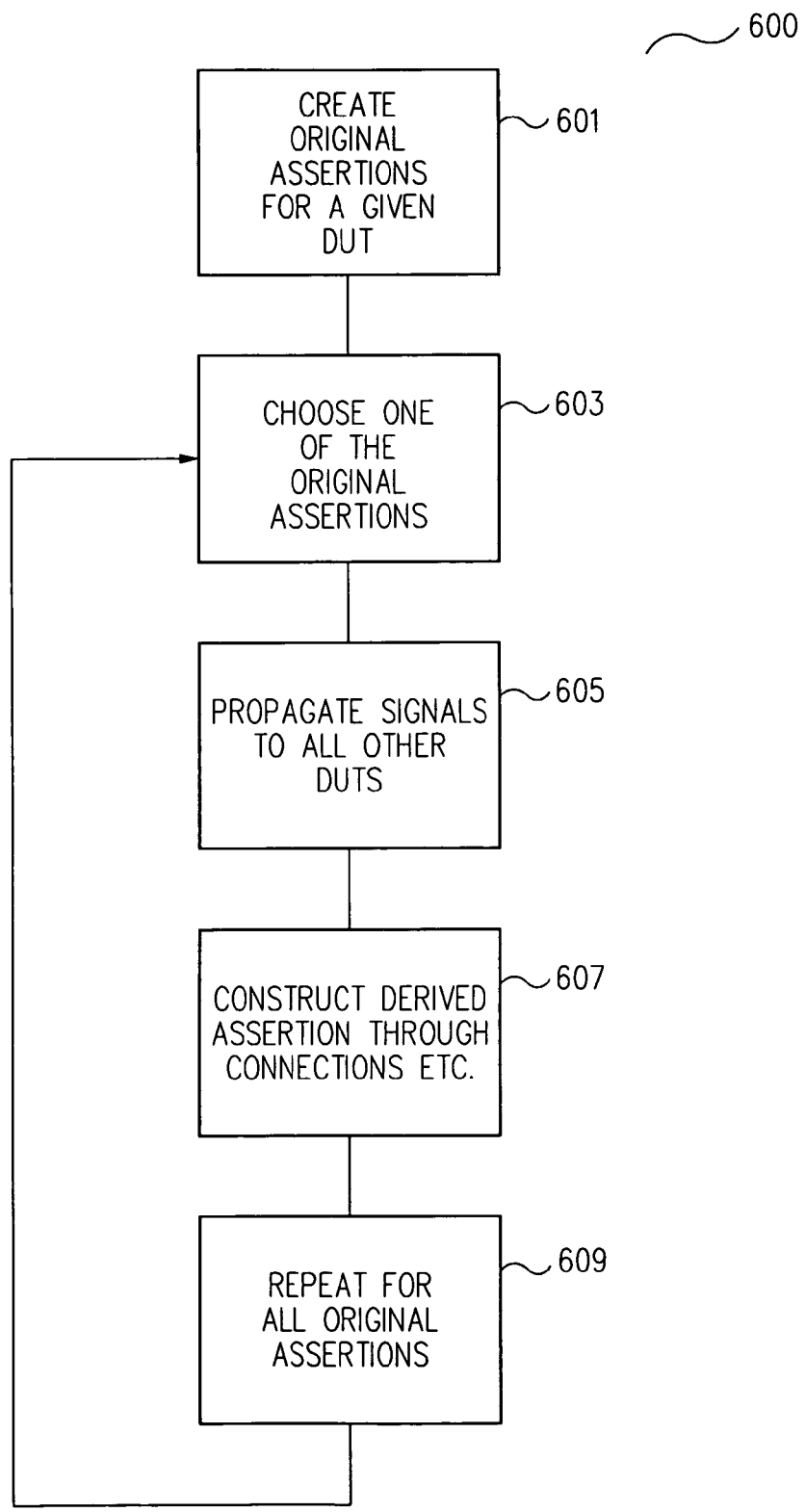
FIG. 6 is a flow diagram for derived assertion morphing according to the principles of one embodiment of the invention.

FIG. 6 is a flow diagram 600 for one embodiment of the method of the present invention, called derived morphing. As shown in FIG. 6, using the derived morphing embodiment of the invention, the design logic of the DUT is compiled to look for the best morphing opportunities. In this instance, at 601, an original set of assertions is created and at 603, an assertion is chosen from the original assertion set. At 605, the signals to all other DUTs are propagated. At 607, a derived assertion is constructed through the direct connections, flip-flop delays, logic equations etc. As a result, the derived assertion is logically equivalent to the original assertion. At 609, the process is repeated for each original assertion. This embodiment of the invention requires understanding of the design and the assertions. In one embodiment of the invention, an internal model is built on the design at the highest hierarchy, i.e., full-chip, by compilation. This is done basically the same way as is done by every equivalence check or property check tool. An equivalence-checking engine is used to exclude redundant assertions so that a unique, or nearly unique, set of assertions is generated at the highest hierarchy. Then each individual DUT is targeted and specific assertions are generated from the list of unique assertions by back traversing the logic core of each assertion using only the signals inside the intended DUT to re-express the assertion. The successfully morphed assertion is then output or dropped if the assertion can't be successfully re-expressed.

Using the methods and apparatus of the present invention, verification constraints will converge much faster for each DUT than using the prior art methods. Typically, the most difficult and time-consuming effort in the design process is the building of a proper constraint environment in order to guide Formal verification engine searching. The present invention significantly reduces this effort by constructive cooperation of assertion development and, using the present invention, the individual DUT constraints are enhanced automatically while other engineers are enhancing their specific targets or constraints.

In addition, using the present invention, very sophisticated assertion targets can be generated while other engineers are perfecting their constraints. This type of constraint-driven assertion development is very powerful for verifying corner cases. Using the present invention, this process can be automated so that assertion targets not only grow more quickly, but, in addition, corner case bugs are detected and fixed earlier and faster.

As discussed above, the present invention provides a method and apparatus to transform or "morph" assertions so that an assertion defined in one DUT can be replicated, or derived, to propagate into other related DUTs. Consequently, using the method and apparatus of the present invention, individual DUTs can better leverage assertions developed independently in other DUT environments. This, in turn, provides for greater productivity and a faster, smoother verification process using the Formal and Assertion Based Verification methods.

As also discussed above, in the prior art, assertions defined in any one of the individual DUTs could only be used in that DUT and not in any of the other DUTs, i.e., each DUT was viewed and verified in virtual isolation form other DUTs and the system as a whole. Consequently, in the prior art, multiple sets of potentially redundant assertions had to be created. However, using the method and structure of the invention, the logical connections between non-DUT specific assertions and the DUT are taken into account, and this information is propagated to all related DUT blocks, in a cluster and/or full chip system in order to leverage all the development efforts of all the designers working on all the different DUTs of the system.

In addition, using the present invention, significant assertion re-use opportunities between blocks are no longer missed and/or ignored as they were in the prior art. Consequently, the difficulty in individually defining the assertions for each DUT, in isolation, that plagued prior art methods, is bypassed and the redundancy that dominated the prior art methods is eliminated. Therefore, using the principles of the present invention, the Formal and Assertion Based Verification methods, long recognized as the more robust and complete verification methods, can be used practically and economically feasibly to functionally verify entire systems with minimal redundancy to accelerate the functional verification process, shorten the time-to-market period and improve the quality of design.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

Consequently, the scope of the invention is defined by the claims and their equivalents.

What is claimed is:

1. A method for deriving assertions so that an assertion defined in one Design Under Test (DUT) can be replicated to propagate into other related DUTs, said method comprising:
   providing a system level DUT comprised of at least one block level DUT;
   preparing a list of Formal verification method assertions for each block level DUT of said system level DUT;
   identifying equivalent assertions from a list of all block level DUTs comprising said system level DUT;
   keeping only unique assertions, either generated originally or as a derivative, in each block level DUT environment;
   keeping derived assertions shared by one or more DUTs; and,
   removing all redundant assertions.

2. A method for deriving assertions so that an assertion defined in one Design Under Test (DUT) can be replicated to propagate into other related DUTs, said method comprising:
   providing a system level DUT comprised of at least one block level DUT;
   defining assertions in the individual block
   preparing a list of all assertions in the individual block level DUT environments;
   requiring design engineers to check all potentially "new" assertions against said list of all assertions in the individual block level DUT environments and adding equivalent assertions to each individual DUT environment whenever an assertion is added;
   preparing a list of Formal verification method assertions for each block level DUT of said system level DUT;
   identifying equivalent assertions identified from collected assertions of all block level DUTs comprising said system level DUT;
   keeping only unique assertions, either generated originally or as a derivative, in each block DUT environment;
   keeping derived assertions shared by one or more DUTs; and,
   removing all redundant assertions.

3. The method for deriving assertions so that an assertion defined in one DUT can be replicated to propagate into other related DUTs of claim 2, wherein;
   a centralized file is created to keep track of the assertions on a given system level design, further wherein;
   if one designer wishes to add or change an assertion in a given block level DUT, the designer writes the assertion in an appropriate assertion description language and makes the assertion available to any verification tool for access.

4. The method for deriving assertions so that an assertion defined in one DUT can be replicated to propagate into other related DUTs of claim 3, wherein;
   if one designer adds or changes an assertion in a given block level DUT, an electronic notification is automatically sent to all affected designers asking them to derive the assertion into their block level DUTs.

5. The method for deriving assertions so that an assertion defined in DUT can be replicated to propagate into other related DUTs of claim 4, wherein;
   said electronic notification is an e-mail.

6. A method for deriving assertions so that an assertion defined in one Design Under Test (DUT) can be replicated to propagate into other related DUTs, said method comprising:
   providing a system level DUT comprised of at least one block level DUT;
   defining assertions in the individual block level DUT environments;
   preparing a list of all assertions in the individual block level DUT environments; and
   for each assertion in said list of all assertions in the individual block level DUT environments replicating said each assertion by replacing an involved signal with a corrected signal in a different DUT to form a new assertion.

7. A method for deriving assertions so that an assertion defined in one Design Under Test (DUT) can be replicated to propagate into other related DUTs said method comprising:
   providing a system level DUT comprised of at least one block level DUT;
   defining assertions in individual block level DUT environments;
   preparing a list of all assertions in the individual block level DUT environments;
   for each assertion in said list of all assertions in the individual block level DUT environments, propagating signals to all other DUTs; and
   constructing a derived assertion direct connections.

* * * * *

UNITED STATES PATENT AND TRADEMARK OFFICE
CERTIFICATE OF CORRECTION

PATENT NO.         : 7,188,324 B1                                   Page 1 of 1
APPLICATION NO.    : 10/893472
DATED              : March 6, 2007
INVENTOR(S)        : Xiaogang Qiu and Si-En Chang It is certified that error appears in the above-identified patent and that said Letters Patent is hereby corrected as shown below:

In Column 11, Line 65, Claim 2, between "assertions in" and "individual", delete "the".
In Column 11, Line 65, Claim 2, after "individual block", insert -- level DUT environments;--.

Signed and Sealed this

Nineteenth Day of June, 2007

JON W. DUDAS
*Director of the United States Patent and Trademark Office*